US007092536B1

(12) United States Patent
Hutt et al.

(10) Patent No.: US 7,092,536 B1
(45) Date of Patent: Aug. 15, 2006

(54) SYSTEM FOR TRANSDUCER COMPENSATION BASED ON AMBIENT CONDITIONS

(75) Inventors: Steven W. Hutt, Bloomington, IN (US); John S. Stewart, Bloomington, IN (US); Ryan J. Mihelich, Indianapolis, IN (US)

(73) Assignee: Harman International Industries, Incorporated, Northridge, CA (US)

( * ) Notice: Subject to any disclaimer, the term of this patent is extended or adjusted under 35 U.S.C. 154(b) by 491 days.

(21) Appl. No.: 10/287,220

(22) Filed: Nov. 4, 2002

Related U.S. Application Data

(60) Provisional application No. 60/379,283, filed on May 9, 2002.

(51) Int. Cl.
*H04R 3/00* (2006.01)
*H04R 29/00* (2006.01)
*H03G 11/00* (2006.01)
*H03G 5/00* (2006.01)

(52) U.S. Cl. ............................ 381/96; 381/55; 381/59; 381/103

(58) Field of Classification Search ............ 381/55–59, 381/103, 61
See application file for complete search history.

(56) References Cited

U.S. PATENT DOCUMENTS

| | | | | |
|---|---|---|---|---|
| 3,997,724 | A * | 12/1976 | Seebinger | 381/59 |
| 4,327,250 | A * | 4/1982 | von Recklinghausen | 381/55 |
| 4,712,247 | A * | 12/1987 | Swarte | 381/96 |
| 4,823,391 | A * | 4/1989 | Schwartz | 381/103 |
| 4,980,920 | A * | 12/1990 | Noro et al. | 381/96 |
| 6,341,166 | B1 * | 1/2002 | Basel | 381/103 |

OTHER PUBLICATIONS

Krump, G., "To the temperature dependence of loudspeaker parameters," In Progress of the Acoustics, pp. 533-534, DEGA 97, Published by DEGA, Oldenburg, 1997. (German publication with English translation).

* cited by examiner

*Primary Examiner*—Laura A. Grier
(74) *Attorney, Agent, or Firm*—Brinks Hofer Gilson & Lione

(57) ABSTRACT

A system for transducer compensation based on ambient conditions includes a transducer, a signal processor and an ambient condition sensor. The signal processor may process audio signals for the transducer. In addition, the signal processor may receive signals from the ambient condition sensor. The signals may represent ambient conditions being experienced by the transducer. The signal processor may dynamically adjust the equalization of the audio signals based on the ambient conditions to optimize operation of the transducer.

32 Claims, 5 Drawing Sheets

SYSTEM FOR TRANSDUCER COMPENSATION BASED ON AMBIENT CONDITIONS

PRIORITY CLAIM

This application claims the benefit pursuant to 35 U.S.C. §119(e) of Provisional U.S. patent application Ser. No. 60/379,283, filed on May 9, 2002.

BACKGROUND OF THE INVENTION

1. Technical Field

The invention generally relates to transducers and, more particularly, to transducer dynamic compensation based on ambient conditions.

2. Related Art

Almost all vehicles and other audio systems include loudspeakers to provide sound based entertainment to listeners. In general, loudspeakers are transducers utilizing electrical signals to reproduce sound. In the prior art, heating resulting from the electrical signals supplied to a loudspeaker voice coil may be determined and the loudspeaker sound performance may be compensated based on the heating.

The performance of loudspeakers is also affected by ambient conditions such as temperature, humidity and barometric pressure. As the ambient conditions vary, the loudspeaker undergoes changes. These changes are most diverse at ambient condition extremes that audio systems and vehicles experience throughout many parts of the world. For example in parts of Canada and Sweden vehicles will be operated at temperatures between −40° C. and +40° C. throughout annual season changes. With sun shining on vehicles, interior cabin and trunks may reach temperatures over +80° C.

The effects of variations in ambient conditions may cause changes up to 100% or greater in some loudspeaker parameters, for example resonance frequency. These changes have implications in at least two areas, namely, quality of sound and robustness. Thus, the loudspeaker will perform differently at different ambient conditions. These variations in performance may cause a change in the quality of the reproduced sound. For example, there may be a difference in the frequency response as the ambient temperature varies.

Robustness refers to the durability of the loudspeaker. When a loudspeaker is operating at extreme ambient conditions the loudspeaker may experiences different mechanical and thermal stresses that can impact the robustness and thus life of the device. The cause of ambient condition induced changes in loudspeaker performance may be due to changes in the properties of the suspension components. Ambient condition induced performance changes may also affect the loudspeaker magnet energy level. As the magnet energy level changes with changing ambient conditions, the force applied to the moving components may be affected. Accordingly, a need exists for loudspeaker dynamic ambient condition compensation.

SUMMARY

The invention provides a transducer compensation system for dynamic transducer compensation based on ambient environmental conditions experienced by a transducer. Ambient conditions such as temperature, barometric pressure, humidity and other climatic related environmental conditions may be monitored with one or more ambient condition sensors. The ambient condition data may be processed by a signal processor capable of adjusting the equalization of audio signals. The audio signals may be provided as outgoing signals to a transducer such as a loudspeaker, or may be received from a transducer, such as a microphone as incoming signals.

The signal processor may perform real-time dynamic equalization of the audio signals based on sensed ambient conditions to optimize performance such as fidelity enhancements. Also, in the case of outgoing audio signals, mechanical protection from undesirable mechanical stresses to the transducer under certain environmental conditions may be provided through detection of the ambient conditions and dynamic equalization of the audio signals. Dynamic equalization may involve adjustment of the power level of one or more equalization frequencies of the audio signals.

The transducer compensation system may be incorporated in the audio head unit or power amplifier of a vehicle. Accordingly, one or more ambient condition sensors in the interior or exterior of the vehicle may provide signals indicative of ambient environmental conditions to the signal processor. Based on these ambient environmental conditions, the audio signals transmitted to the loudspeakers may be dynamically equalized to optimize performance. In addition, audio signals from a microphone included in the vehicle, such as a microphone used for wireless voice communication, may be dynamically equalized based on ambient conditions by the signal processor.

When, for example, an audio system in a vehicle is energized during ambient conditions, such as high ambient environmental temperature, the signal processor may sense the high temperature condition within the vehicle. Based on the high temperature, the signal processor may dynamically compensate the equalization frequencies of the audio signals to maintain high fidelity and/or avoid mechanical stress of a loudspeaker located within the vehicle. As the vehicle air conditioner lowers the ambient temperature, the signal processor may sense the lower temperature and adjust the compensation of the audio signal equalization frequencies accordingly. Similarly, dynamic compensation of the equalization frequencies of the audio signals may be performed by the signal processor in low ambient temperature conditions while the heater within the vehicle raises the ambient temperature.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like reference numerals designate corresponding parts throughout the different views.

DETAILED DESCRIPTION OF THE PREFERRED EMBODIMENTS

This invention provides a transducer compensation system for transducer compensation based on ambient conditions. Transducers may receive incoming audio signals to reproduce sound, or may produce outgoing audio signals from sound. Ambient conditions affecting the performance and behavior of transducers may include temperature, humidity, barometric pressure, and/or any other climatic related conditions. One or more sensors may be utilized to monitor these ambient conditions. Audio signals may be dynamically adjusted to optimize performance of the transducers based on the ambient conditions.

Figure 1:
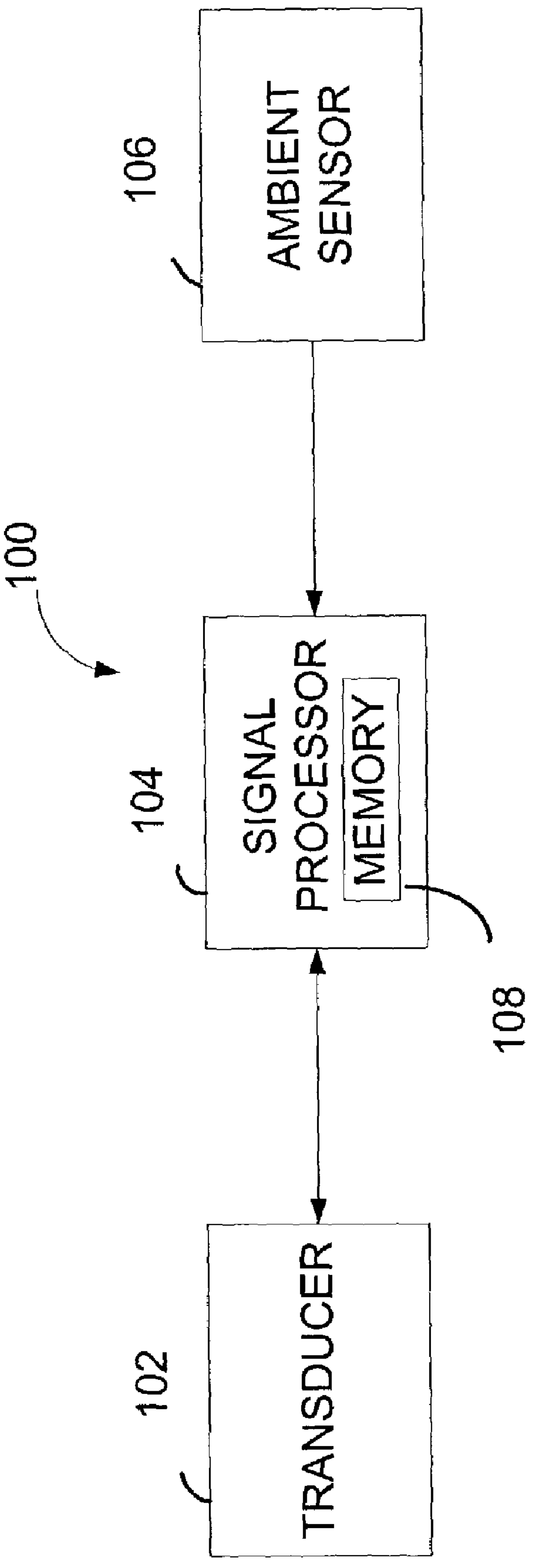
FIG. 1 is a block diagram illustrating an example audio system that includes a transducer compensation system.

FIG. 1 is an example embodiment of an audio system 100 that includes the transducer compensation system. The audio system 100 includes at least one transducer 102, at least one signal processor 104 and at least one ambient condition sensor 106. In other example embodiments, other audio system configurations may be utilized, such as, surround sound system audio systems, arena public address audio systems, concert hall audio systems, outdoor audio systems or any other form of audio system where ambient conditions may fluctuate.

The transducer 102 may be any device(s) capable of translating between mechanical vibrations and electrical signals. The transducer 102 may be, for example, a loudspeaker, a microphone and/or any other audio system related device. The signal processor 104 is an audio signal processing means for processing audio signals and may be any logic based mechanism(s) capable of executing instructions stored in a memory 108. The signal processor 104 may be a digital signal processor (DSP), a microprocessor or any other mechanism capable of receiving digital inputs and providing digital outputs based on execution of instructions stored in the memory 108. The memory 108 may be any form of data storage mechanism accessible by the signal processor 104, such as, a magnetic media, an optical disk, a random access memory (RAM), flash memory, electrically erasable programmable read-only memory (EEPROM), etc.

The ambient condition sensor(s) 106 may be any device (s) or mechanism(s) capable of sensing at least one ambient environmental condition and providing a representative signal. Accordingly, the ambient condition sensor 106 is a signal generating means for generating signals indicative of an ambient environmental condition. Ambient environmental conditions should be broadly construed to include any environmentally related climatic conditions, such as, temperature, humidity, barometric pressure, etc. The environment in which ambient conditions are sensed may be the environment currently being experienced by the transducer 102.

During operation, ambient environmental conditions sensed by the ambient condition sensor 106 may be provided on a real time basis by transmission of a continuous signal fed from the ambient sensor 106 to the signal processor 104. Similarly, audio signals may be transmitted to, or received from, the transducer 102. The signal processor 104 may process the signals and dynamically adjust the equalization of the audio signals to optimize performance of the transducer 102.

Optimization of the performance of the transducer 102 may include compensation to minimize the operational effect on performance due to changes in ambient conditions. Variations in ambient conditions may affect the stiffness of materials such as the suspension of the transducer 102. In addition, ambient conditions may affect other operational parameters such as, the magnet energy level of a loudspeaker. Accordingly, the magnitude of displacement of the transducer 102 may be affected by variations in ambient conditions. Compensation may minimize such variations by linearizing differences in operational performance due the ambient influences.

Figure 2:
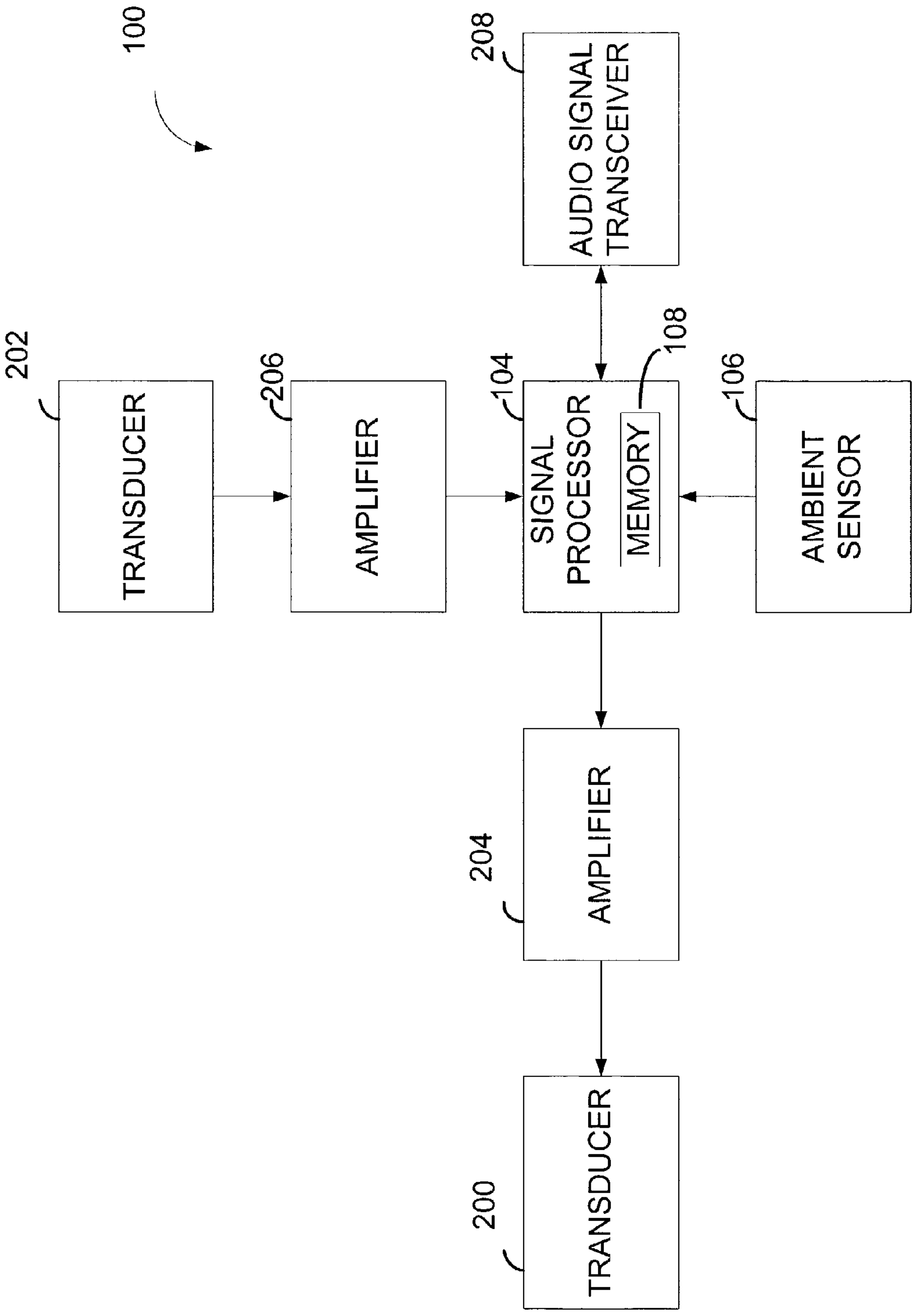
FIG. 2 is a block diagram illustrating an example audio system that includes the transducer compensation system.

FIG. 2 is an example audio system 100 preferably operating in a vehicle. The audio system 100 may also operate in any configuration, location, structure or enclosure. The illustrated audio system 100 includes at least one transducer. In FIG. 2, a first transducer 200 and a second transducer 202 are illustrated along with a signal processor 104 and an ambient condition sensor 106. In addition, the audio system 100 may include at least one amplifier. Two amplifiers 204 and 206 are illustrated to support operation of the first and second transducers 200 and 202, respectively. In other example audio systems however, one or more amplifiers may support the first and second transducers 200 and 202.

The illustrated audio system 100 further includes at least one audio signal transceiver 208. The amplifier(s) 204 and 206 may be any device(s) capable of receiving an electrical signal as an input and providing an amplified electrical signal as an output. The audio signal transceiver 208 may be any device capable of receiving and transmitting audio signals. Example audio signal transceivers 208 include tuners, compact disc players, tape players, wireless telephones, wireless radios, etc.

The first transducer 200 illustrated in FIG. 2 may be any device capable of receiving audio signals and reproducing sound such as a loudspeaker. The second transducer 202 may be any device capable of outputting audio signals that are representative of sound received by the second transducer 202 such as a microphone. The first transducer 200 may be at least one loudspeaker for use within the vehicle of the example audio system of FIG. 2. The second transducer 202 may be at least one microphone for use in connection with wireline and/or wireless communication equipment within the vehicle. The first transducer 200 may receive audio signals from the signal processor 104 that have been amplified by the amplifier 204. Conversely, the signal processor 104 may receive audio signals from the second transducer 202 via the amplifier 206.

The signal processor 104 may also receive signals from the ambient condition sensor 106 indicative of ambient conditions. In addition, the audio signals may be sent between the signal processor 104 and the audio signal transceiver 208. As previously discussed, the signal processor 104 may utilize the signals from the ambient sensor 106 to optimize performance of the transducers 200 and 202.

Optimization of performance of the transducers 200 and 202 may involve adjustments to the equalization of the audio signals provided to, and received from, the transducers 200 and 202. Equalization of the audio signals may include increasing or decreasing the power of one or more frequencies, or range of frequencies within the audio signals. The signal processor 104 may adjust the power level(s) of the frequency(s) based on the effect of the ambient condition(s) on the transducers 200 and 202. As previously discussed, operational behavior of the transducers 200 and 202 may vary significantly as ambient conditions vary. Such behavioral variations may be the result of the effect of ambient conditions on the materials within the transducers 200 and 202.

Determination of the effect of the ambient conditions on the operational behavior of the transducers 200 and 202 may be based on operational testing of the transducers 200 and 202 under simulated conditions. Simulated ambient environmental conditions may be provided by an environmental stress lab, such as Envirotronics™ test chambers manufactured by Envirotronics, Inc. of Grand Rapids Mich.

Simulation of the operational characteristics of the transducers 200, 202 as the ambient condition(s) are varied may be based on analysis of frequency response, distortion and impedance curves when repeatable audio signals are supplied to the first transducer 200 and generated by the second transducer 202. A distortion analyzer, such as a Klippel distortion analyzer may be used to capture the linear and non-linear characteristics of the transducers 200 and 202 at different ambient conditions. The acquired data may be utilized to calculate small signal parameters and/or large signal parameters to determine the changes in the performance of the transducers 200 and 202 as ambient conditions are varied.

Figure 3:
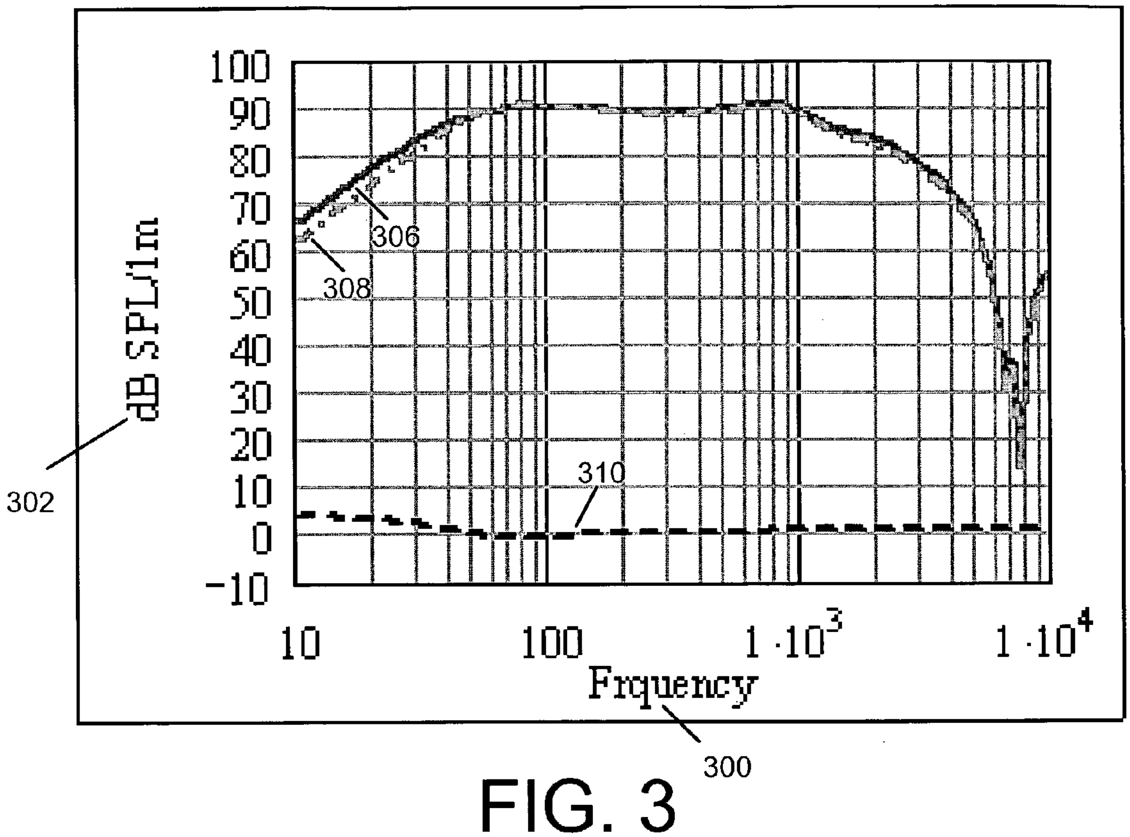
FIG. 3 is a graph illustrating an example equalization curve to compensate for variations in the response curves of a transducer resulting from operation at an ambient condition of 18° C. and −40° C.
Figure 4:
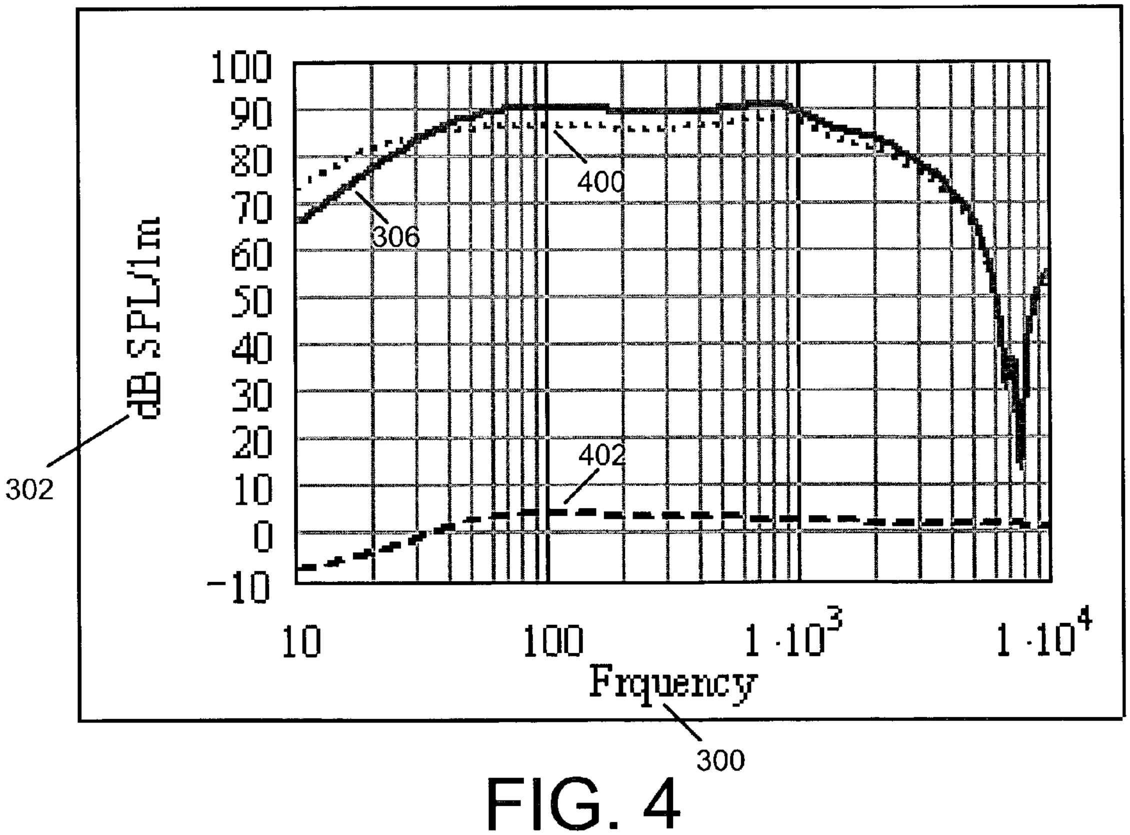
FIG. 4 is a graph illustrating an example equalization curve to compensate for variations in the response curves of a transducer resulting from operation at an ambient condition of 18° C. and +40° C.

FIGS. 3 and 4 are example graphs depicting a frequency response comparison and resulting compensation at different ambient conditions. The graphs illustrate changes in the operational performance of an example transducer throughout a range of frequency when the ambient condition of temperature varies. In these examples, the transducer is a loudspeaker. The graphs of FIGS. 3 and 4 depict frequency 300 on the X-axis and decibel sound pressure level at one meter (dBSPL/1M) 302 on the Y-axis. Other ambient conditions and/or other performance related parameters may similarly be utilized to develop compensation in other examples.

In FIG. 3, the graph includes a first response curve 306 of the transducer when subject to audio signals of a constant voltage and the illustrated range of frequencies. The first response curve 306 may represent operation at a design temperature such as a room temperature of 18 degrees Celsius. Also included is a second response curve 308 representing operation of the transducer at another temperature, such as, minus forty degrees Celsius with audio signals of the same constant voltage and frequency range. A first compensation curve 310 is also included on the graph of FIG. 3. In the illustrated example, the compensation curve 310 represents the sum difference in decibel sound pressure level at one meter between the first and second response curves 306 and 308 throughout the illustrated frequency range. Accordingly, application of more or less power at each frequency in the frequency range may provide compensating equalization to allow the transducer to perform similarly to the design temperature when the temperature of the ambient conditions is minus forty degrees Celsius.

FIG. 4 similarly depicts an example frequency response comparison of the operation of a transducer when the ambient condition of temperature changes. As in FIG. 3, the first response curve 306 of FIG. 4 represents operation of the transducer at the design temperature such as eighteen degrees Celsius. A third response curve 400 represents the operational effect on the transducer when the ambient condition of temperature is varied to another temperature such as plus forty degrees Celsius. The sum difference of the first and third response curves 306 and 400 is similarly depicted by a second equalization curve 402 which may be applied to the audio signals to dynamically compensate for operation at plus forty degrees Celsius.

Referring again to FIG. 2, a family of equalization curves may be developed and stored in a look up table in the memory 108. The family of equalization curves may be unique for each transducer 200 and 202 or may be representative of classes, models or sets of transducers 200 and 202. The lookup table may be accessed by the signal processor 104 during operation to dynamically adjust the frequency(s) based on ambient conditions. Interpolation may be utilized by the signal processor 104 for ambient conditions not represented by the family of equalization curves. Alternatively, feedback signals may be utilized such that the signal processor 104 may include some form of artificial intelligence and/or create a database during operation to represent the operational relationship between transducer behavior and ambient conditions. The signal processor 104 may then optimize performance of the transducers 200 and 202 based on the relationships created.

Dynamic adjustment of the equalization by the signal processor 104 may provide fidelity enhancement and/or device protection. Fidelity enhancement may involve adjusting the power level(s) of the frequency(s) to maintain optimum fidelity throughout the range of possible ambient conditions the transducers 200 and 202 may experience. Similarly, device protection may involve adjusting the frequency(s) to protect the first transducer 200 from being overstressed or otherwise damaged by the audio signals under different ambient conditions.

In the case of audio signals provided to the first transducer 200, dynamic optimization may involve both fidelity enhancement and device protection. Audio signals provided to the first transducer 200 at some power level may be acceptable under certain ambient conditions, and undesirable under other ambient conditions. For example, when the ambient temperature, and therefore the temperature of the suspension and cone of a loudspeaker is low, lack of flexibility in the materials may compromise fidelity at low audio signal levels. In addition, the lack of flexibility may increase the likelihood of irreparable stress to moving components such as the suspension, voice-coil or cone at high audio signal levels. If, on the other hand, the ambient temperature and therefore the transducer temperature is high, increased flexibility in the suspension and cone may similarly compromise fidelity and/or cause undesirable stress. Such conditions may be addressed by adjustments to the equalization of the audio signals by the signals processor 104 based on ambient conditions.

In the case of audio signals provided from the second transducer 202, dynamic optimization may involve fidelity enhancement. Similar to the first transducer 200, changes in ambient conditions may detrimentally affect performance of the materials within the second transducer 202. Accordingly, fidelity enhancement of the audio signals may be performed by the signal processor 104 to compensate for such detrimental effects.

During operation in the example audio system 100 illustrated in FIG. 2, audio signals received from the audio signal transceiver 208 may be adjusted by the signal processor 104 based on ambient conditions and the expected behavior of the first transducer 200. Following adjustment of one or more of the audio signal frequencies, the audio signals may be provided to the first transducer 200.

Audio signals received from the second transducer 202 by the signal processor 104 may be adjusted twice based on ambient conditions. Adjustments to the equalization of the audio signal may first be performed to provide fidelity enhancement based on the operational performance of the second transducer 202 in producing the audio signals while experiencing the ambient conditions. Further adjustments may then be made by the signal processor 104 based on ambient conditions and the expected operational performance of the first transducer 200 while experiencing the ambient conditions before the audio signals are provided to the first transducer 200.

Alternatively, audio signals that are received from the second transducer 202 and provided to the audio signal transceiver 208 may be adjusted once. Adjustments to the equalization of the incoming audio signals may be performed by the signal processor 104 based on the operational behavior of the second transducer 202 in the ambient conditions experienced by the second transducer 202.

The ambient condition sensor 106 may be one or more independent sensors monitoring climatic environmental conditions in the interior of the vehicle. Accordingly, ambient condition sensors 106 may be positioned in close proximity or at the location of each transducer 200 and 202 within the vehicle. The signal processor 104 may independently equalize the audio signals provided to, or received from, each transducer 200 and 202. Alternatively, the ambient condition sensor(s) 106 may be placed in a predetermined location representative of climatic conditions within and/or around the vehicle. In another alternative configuration, the signal processor 104 may extrapolate ambient conditions at the location of each of the transducers 200 and 202 in the vehicle based on ambient conditions monitored at a predetermined location(s). Equalization of the audio signals may also be performed by the signal processor 104 based on other parameters such as, road noise, voice-coil heating or any other parameters available to the signal processor 14.

Figure 5:
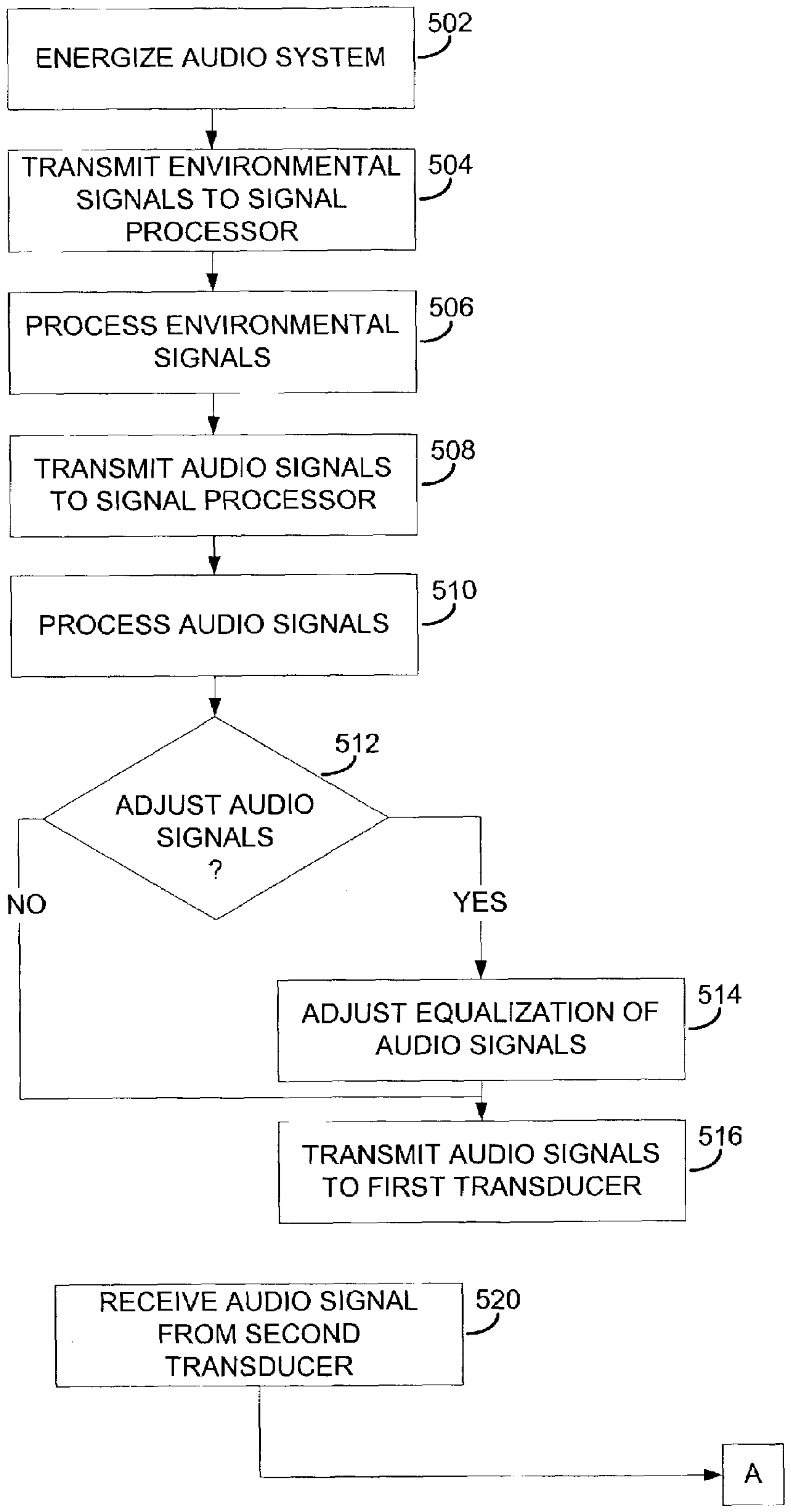
FIG. 5 is a process flow diagram depicting example operation of the transducer compensation system.

FIG. 5 is a process flow diagram illustrating example operation of the transducer compensation system discussed with reference to FIGS. 1–4. The operation begins at block 502 when the audio system 100 is energized. At block 504, the ambient condition sensor 106 transmits environmental signals indicative of ambient environmental conditions, such as temperature to the signal processor 104. The signal processor 104 executes instructions stored in the memory 108 to process the environmental signals and determine the existing ambient environmental conditions at block 506. At block 508, the audio signal transceiver 208, such as a CD player, transmits audio signals representative of sounds, such as music, to the signal processor 104.

The signal processor 104 again executes instructions stored in the memory 108 to process the audio signals and determine the equalization (e.g. the power levels of the frequencies) of the audio signals at block 510. At block 512 further instructions are executed by the signal processor 104 to determine if adjustment of at least one of the frequencies of the audio signals is needed to compensate for operation of the first transducer 200 in the current ambient conditions. The determination may be based on a look up table previously stored in the memory 108 for the first transducer 200 and the current ambient conditions.

If it is determined that adjustment is needed, the signal processor 104 executes instructions to adjust the equalization by adjusting the power level of at least one frequency of the audio signals at block 514. At block 516, the signal processor 104 transmits the equalization adjusted audio signals to the transducer 200, such as a loudspeaker. If the audio signals do not need adjustment at block 512, the unadjusted audio signals are transmitted to the transducer 200 at block 516. At block 520, audio signals representative of sound present at the second transducer 202, such as a human voice, are received by the signal processor 104 from the second transducer 202.

Figure 6:
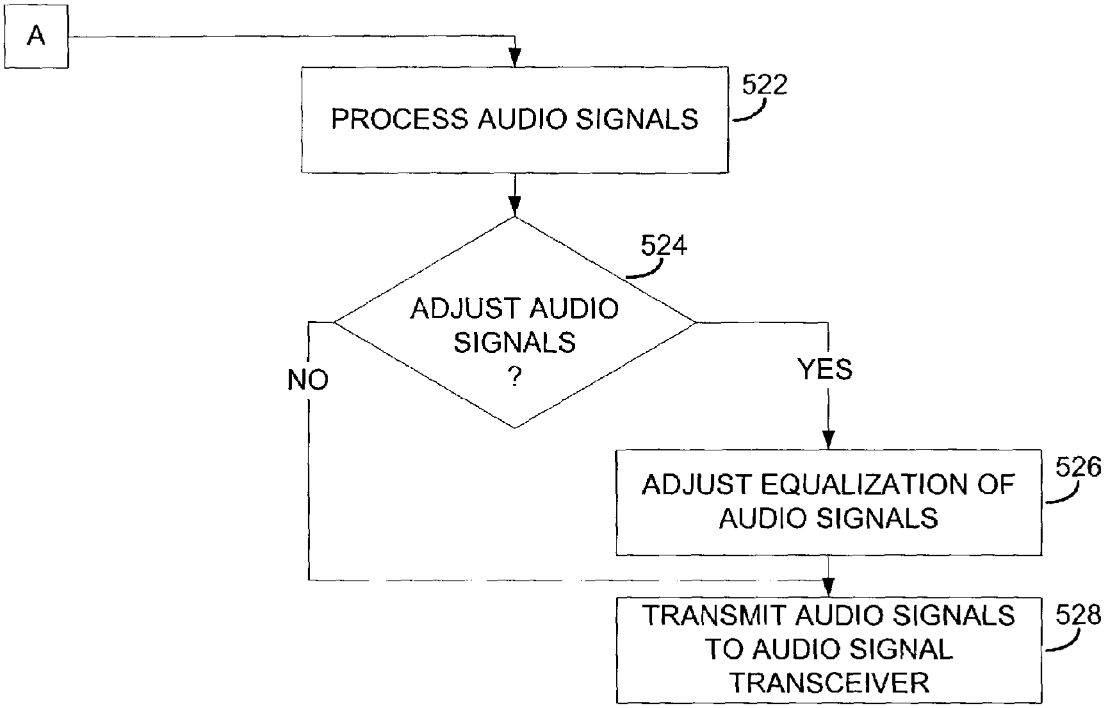
FIG. 6 is a second part of the process flow diagram of FIG. 5.

The operation continues on FIG. 6, where at block 522 the signal processor 104 executes instructions stored in the memory 108 to process the audio signals and determine the equalization (e.g. the power levels of the frequencies) of the audio signals. The signal processor 104 executes additional instructions to utilize a look up table associated with the second transducer 202 and determine if adjustment of the audio signals is needed based on the current ambient conditions at block 524. If yes, the signal processor 104 further executes instructions to adjust the equalization by adjusting the power level of at least one frequency of the audio signals at block 526. At block 528, the adjusted audio signals are transmitted to the audio signal transceiver 208, such as a wireless telephone. If no adjustment of the audio signals is needed at block 524, the operation transmits the unadjusted audio signals to the audio signal transceiver 208 at block 528.

While various embodiments of the invention have been described, it will be apparent to those of ordinary skill in the art that many more embodiments and implementations are possible that are within the scope of the invention. Accordingly, the invention is not to be restricted except in light of the attached claims and their equivalents.

What is claimed is:

1. A system for transducer compensation based on ambient conditions comprising:

a transducer;

a signal processor coupled with the transducer, where the signal processor is operable to process audio signals for the transducer; and an ambient condition sensor coupled with the signal processor, where the ambient condition sensor provides signals to the signal processor that are representative of only ambient conditions of an environment surrounding the transducer, and the signal processor is operable to adjust the audio signals as a function of the signals provided by the ambient condition sensor to optimize audible sound receivable or producible by the transducer.

2. The system of claim 1, where the transducer is one of a loudspeaker and a microphone.

3. The system of claim 1, where the ambient conditions are at least one of ambient temperature and ambient barometric pressure.

4. The system of claim 1, further comprising an audio amplifier coupled between the transducer and the signal processor.

5. The system of claim 1, where the signal processor is operable to adjust the audio signals by adjustment of the equalization of the audio signals.

6. The system of claim 1, where the signal processor is operable to dynamically adjust the audio signals to compensate for the operational effect of ambient conditions on the transducer.

7. The system of claim 1, where the transducer includes a suspension, the signal processor operable to compensate for the effect of ambient conditions on the stiffness of the suspension by adjustment of the audio signals.

8. A system for transducer compensation based on ambient conditions comprising:

an ambient condition sensor operable to generate signals indicative of only an environmentally related climatic condition; and a signal processor coupled with the ambient condition sensor, where the signal processor is operable to dynamically compensate for the operational effect of the environmentally related climatic condition on a transducer through adjustment of a frequency of audio signals as a function of the signals indicative of the environmentally related climatic condition.

9. The system of claim 8, where the environmentally related climatic condition is indicative of the ambient conditions in the vicinity of a transducer coupled with the signal processor.

10. The system of claim 8, where the system is an audio system in a vehicle, and the environmentally related climatic condition is representative of environmental conditions in the vehicle experienced by the transducer.

11. The system of claim 8, further comprising an audio signal transceiver coupled with the signal processor, the audio signal transceiver operable to send and receive audio signals.

12. The system of claim 8, where the transducer is a plurality of transducers comprising a first transducer operable as a microphone and a second transducer operable as a loudspeaker, where audio signals generated by the first transducer are dynamically compensated for the environmentally related climatic condition by the signal processor, the signal processor operable to perform additional dynamic compensation of the audio signals as a function of the environmentally related climatic condition prior to transmission of the audio signals to the second transducer.

13. The system of claim 8, where the signal processor is operable to access a lookup table stored in a memory device, where the lookup table includes a family of compensation curves for the transducer.

14. A system for transducer compensation based on ambient conditions comprising:

means for generating signals indicative of only an ambient condition of an environment surrounding a transducer; and means for processing audio signals coupled with the means for generating signals indicative of the ambient conditions, the means for processing audio signals operable to process audio signals for the transducer as a function of the signals indicative of the ambient condition to compensate for the operational effect of the ambient condition on the transducer.

15. The system of claim 14, where the ambient condition is an ambient temperature experienced by the transducer.

16. The system of claim 14, where the means for processing audio signals is operable to process audio signals received from the transducer.

17. The system of claim, 14, further comprising an audio signal transceiver, where the means for processing audio signals is operable to process audio signals received from the audio signal transceiver and subsequently provide the audio signals to the transducer.

18. The system of claim 14, where the means for processing audio signals is operable to dynamically adjust the equalization of the audio signals to optimize operational performance of the transducer in the ambient condition of the environment surrounding the transducer.

19. A system of software program instructions for transducer compensation based on ambient conditions comprising:

instructions stored in a memory device to process signals indicative of only ambient conditions of an environment surrounding a transducer;

instructions stored in the memory device to process audio signals; and instructions stored in the memory device to dynamically adjust the audio signals as a function of the ambient conditions, the audio signals adjusted to compensate for the operational effect of the ambient conditions on audible sound received or output by the transducer.

20. The system of claim 19, further comprising instructions stored in the memory device to access a lookup table based on the ambient conditions to determine the adjustment of the audio signals.

21. The system of claim 19, further comprising instructions stored in the memory device to increase and decrease the power level of at least one frequency of the audio signals to dynamically adjust the audio signals.

22. The system of claim 19, further comprising instructions stored in the memory device to protect against undesirable mechanical stresses resulting from audio signals provided to the transducer.

23. The system of claim 19, further comprising instructions stored in the memory to enhance fidelity of the audio signals based on the ambient conditions to optimize performance of the transducer.

24. A method of compensating a transducer based on ambient conditions, the method comprising:

providing an audio signal;

measuring at least one ambient condition that is indicative of only an environmental condition surrounding a transducer; and adjusting the equalization of the audio signal as a function of the at least one ambient condition to compensate for operation of the transducer operable in the at least one ambient condition.

25. The method of claim 24, further comprising sending the equalization adjusted audio signal to the transducer.

26. The method of claim 24, where providing comprises receiving the audio signal from the transducer.

27. The method of claim 24, where adjusting the equalization comprises adjusting the power level of at least one frequency within the audio signal.

28. The method of claim 24, where adjusting the equalization comprises accessing a lookup table, the lookup table indicative of changes in operation of the transducer in response to changes in ambient conditions.

29. The method of claim 24, where adjusting the equalization comprises compensating to maintain the linearity of the operational response of the transducer.

30. The method of claim 24, where measuring at least one ambient condition comprises measuring ambient conditions at the location of the transducer.

31. The method of claim 24, where measuring at least one ambient condition comprises measuring ambient conditions in a location representative of the ambient conditions at the location of the transducer.

32. The method of claim 24, where measuring at least one ambient condition comprises measuring ambient conditions in a predetermined location, and extrapolating to determine ambient conditions at the location of the transducer.

* * * * *